United States Patent [19]

Enke et al.

[11] Patent Number: 4,490,806
[45] Date of Patent: Dec. 25, 1984

[54] HIGH REPETITION RATE TRANSIENT RECORDER WITH AUTOMATIC INTEGRATION

[75] Inventors: Christie G. Enke; Bruce H. Newcome, both of East Lansing; John F. Holland, Lansing, all of Mich.

[73] Assignee: Research Corporation, New York, N.Y.

[21] Appl. No.: 385,115

[22] Filed: Jun. 4, 1982

[51] Int. Cl.³ .............................................. G06F 15/20
[52] U.S. Cl. ..................................... 364/734; 364/575
[58] Field of Search ............... 364/734, 733, 736, 768, 364/575

[56] References Cited

U.S. PATENT DOCUMENTS

| 3,087,487 | 4/1963 | Clynes | 364/734 X |
| 3,182,181 | 5/1965 | Schumann | 364/734 |
| 3,840,861 | 10/1974 | Amdahl et al. | 364/200 |
| 4,054,786 | 10/1977 | Vincent | 364/575 |

OTHER PUBLICATIONS

Fornili, "Simple Microcomputer Upgrades a Transient Recorder for Signal Averaging" *J. Phys. E. Sci. Instrum.*, vol. 13, 1980, pp. 271-272.
Lanting et al., "Recording and Averaging Transients with High Repetition Rates" *J. Phys. E. Sci. Instrum.*, vol. 12, 1979, pp. 817-819.
K. A. Lincoln, "Data Acquisition Techniques for Exploiting the Uniqueness of the Time-of-Flight Mass Spectrometer: Application to Sampling Pulsed Gas Systems", *Dyn. Mass Spectrom.*, vol. 6, pp. 111-119, (1981); Also Published as NASA Report TM-81224.

*Primary Examiner*—David H. Malzahn
*Attorney, Agent, or Firm*—Scully, Scott, Murphy & Presser

[57] ABSTRACT

A system for high speed acquisition and storage of data from transient electrical signal waveforms sampled in time at a multiplicity of points, and where it is desired to collect and store data in real time in a mass storage unit, but where the data rate is in excess of the apparent rate at which data can be transferred to mass storage. The overall system employs two levels of data reduction, the first being digital integration (summation) and the second being data processing. In the digital summation section memory read and write cycles overlap for higher speed. In one embodiment, a charge-coupled device is employed as an input element to reduce the data rate prior to subsequent digital processing. The system is capable of recording all the intensities of all transients continuously without loss of data significance.

16 Claims, 6 Drawing Figures

HIGH REPETITION RATE TRANSIENT RECORDER WITH AUTOMATIC INTEGRATION

CONTRACT CLAUSE

Support for this invention was received through Michigan State University, National Institutes of Health, and Office of Naval Research.

BACKGROUND OF THE INVENTION

The present invention relates to high speed acquisition and storage of data from transient electrical signal waveforms sampled in time at a multiplicity of points. The invention particularly relates to situations where it is desired to collect and store data in real time in a mass storage unit such as a magnetic disk unit, but where the data rate is in excess of the apparent rate at which data can be transferred to mass storage.

The subject transient recorder was developed specifically in the context of recording the output of a time-of-flight (TOF) mass spectrometer, but has other applications as well. In particular, the subject invention has application in any transient data recording situation where repetitive transients occur at a relatively high rate but the information from one transient to the next changes at a relatively slow rate. As another example, the present invention has application where a chemical system is pulsed with a laser to produce decaying fluorescence output pulses. However, for purposes of example and to facilitate description, the invention is described herein in the context of TOF mass spectrometry.

In a time-of-flight mass spectrometer, sample ions are produced and then extracted and accelerated by an accelerating voltage applied to suitable acceleration electrodes. A typical value of accelerating voltage is 3.5 kV. Constant energy and constant-momentum acceleration modes are known.

In either case, lighter (lower mass) ions are accelerated to higher velocities than the heavier ions. The ions then enter a drift region or flight tube which establishes an ion path length 1, and which is followed by an ion detector. In the drift region, the ions separate along the ion path as a function of their individual velocities and thus arrive at the ion detector at different times depending upon their velocities, and therefore, depending upon their mass.

To permit measurement of flight time, ions in a time-of-flight mass spectrometer are bunched, typically by means of a pulsed ion source, and all ions of a given bunch enter the drift region at substantially the same position and time. By correlating ion pulsing or bunching with arrival time of various ions at the ion detector, the time-of-flight of each individual ion or group of identical-mass ions can be determined. Ion velocity follows from the simple relationship:

(Velocity)=(Path Length)/(Time-Of-Flight).

From velocity, ion mass can be calculated, taking into account the characteristics of the ion accelerator.

With an ion path or flight length 1 of 1.0 meter, all ions from one pulse of the ion source, ranging from 1 to 1000 mass units, reach the ion detector within 40 microseconds. Many individual ions of any given mass may reach the detector at substantially the same time, ranging up to several hundreds of ions. The source pulses are repeated at a rate in the order of 10 to 25 kHz.

The output of the ion detector is a transient waveform for each source pulse. Each transient waveform has a magnitude which varies as a function of time, with peaks of the waveform along a time axis corresponding to different masses of the various sample ions.

It will be appreciated that the data rate is extremely high, much faster than can be stored by any known mass storage unit (i.e., a magnetic disk unit). For example, in each transient there may be as many as 16,000 relevant sample points in time (or "time bins"). At a source pulse rate of 10 kHz, these two factors give a data rate of $1.6 \times 10^8$ items of information per second. Moreover, for any given time bin up to several hundred ions may be arriving which can be represented by a data word of eight binary bits. Optimally, every single ion arriving at the ion detector can be resolved with intensities of 255 ions per bin or less. This last factor increases the potential data rate to $1.3 \times 10^9$ bits per second. Clearly this is too fast for known mass storage techniques.

Commonly-available commercial time-of-flight mass spectrometers record detected ion current intensities by sampling techniques. Ion current is sampled during only one arrival time for each source pulse. A sampling window or time slice (aperture time) is established and the delay from the extraction pulse to this window is slowly scanned over all arrival times of interest while the source is repetitively pulsed, thereby recording a complete mass spectrum of the sample under study by collecting the ion intensities for each successive arrival time. This technique is known as Time-Slice Detection (TSD).

Additionally integrating forms of time-slice detectors have been employed, known as "boxcar integrators". The boxcar integrator is triggered for each ion pulse, and integrates ion current during the same aperture time at a constant arrival time for a number of pulses. The arrival time can either be constant or be slowly scanned.

Integration itself represents a means of data flow reduction where the information contained in successive pulses is changing slowly, as is the case in many TOF mass spectrometry applications. Although the data pulses are occurring at a 10 kHz rate, the spectrum each pulse detects is changing at a much slower rate, and time-resolved data from 10 to 1000 scans can be integrated or averaged without loss of actual information.

Time-Slice Detection has the disadvantage of losing most of the information available in the ion beam since aperture time is a small fraction of the total time over which ions are arriving at the detector. This creates a potential problem where sampling times or sample quantities are limited. Accordingly, various devices for Time Array Detection (TAD) have been proposed, known variously as "transient recorders" or "digital transient recorders". Such recorders, rather than responding to a single time slice relative to the pulsed source, collect the entire output from a single source pulse in a time-of-flight mass spectrometer to produce individual time-resolved data channels for each of a multiplicity of sample points taken serially in time.

For example, Lincoln has constructed a detector system which captures a substantial fraction of the information in a single ion source pulse from a time-of-flight mass spectrometer employing a digital transient recorder having a 2K memory (Biomation Model 8100). See K. A. Lincoln, "Data Acquisition Techniques for Exploiting the Uniqueness of the Time-of-Flight Mass Spectrometer: Application to Sampling Pulsed Gas Systems", *Dyn. Mass Spectrom.*, 6, 111-119 (1981); also published as NASA Report Tm-81224.

Prior art digital transient recorders, although offering an improvement over time-slice detection, are not capable of measuring ten thousand transients per second consistent with the ten thousand per second pulse rate typical in TOF mass spectrometry, and thus lose data as a result of spectra not collected. In particular, their data readout time is in the order of milliseconds, and is inconsistent with the 10 kHz or greater pulse rate of time-of-flight analysis. Moreover, only a limited number of time-resolved channels, for example 2000, are available in typical prior art instruments.

Just as a boxcar integrator is an integrating form of time-slice detector, integrating forms of digital transient recorders have been employed, although operating relatively slowly.

One example of such a device is known as a Computer of Average Transients, or "CAT".

As another example, the Lincoln digital transient recorder, as described in the literature cited above, has its digital output connected to a separate "Signal Averager" which functions as an integrator. For this purpose, Lincoln employs a Nicolet Model 1170 with a Model 178 plug-in unit specifically made for digital-to-digital interfacing with the Biomation Transient Recorder. As Lincoln points out, known "signal averagers" are not fast enough to acquire spectra in real time. In the Lincoln system, the rate-determining (rate-limiting) factor is the approximately three milliseconds required to dump the 2000-word memory of the transient recorder into the signal averager. This sequence of events enables only 330 transient pulses to be analyzed each second.

Up to this point, the background of the invention has been described in the context of conventional time-of-flight (TOF) mass spectrometry. Indeed, the present invention provides significant advantages in conventional TOF mass spectrometry.

There is, however, another, completely new form of time-resolved mass spectrometry with which the subject invention may be employed as an element of an overall detector system. Specifically, this new form of time-resolved mass spectrometry is disclosed and claimed in commonly-assigned U.S. patent application Ser. No. 385,114, filed June 4, 1982, concurrently herewith, by Christie George ENKE, John Timothy STULTS and John Francis HOLLAND, entitled "COMBINATION OF TIME RESOLUTION AND MASS DISPERSIVE TECHNIQUES IN MASS SPECTROMETRY". In the instruments disclosed in the above-identified application Ser. No. 385,114, time-of-flight mass spectrometry techniques are simultaneously combined with path-bending spatial dispersion in magnetic- or electric-sector mass spectrometers to improve the mass resolution or, with an ion fragmentation region, to rapidly obtain the same multidimensional mass spectral data previously obtained by tandem mass spectrometry. The technique may be identified as time-resolved magnetic or electric-sector mass spectrometry. The instrumentation generates data defining relationships between selected parent ions and daughter ions produced by fragmentation (either metastable or induced), data to differentiate stable from metastable ions, and data to improve mass resolution.

In these instruments, it is highly advantageous to rapidly and continuously collect data in real time so that the full benefits of the combined techniques can be achieved. Specifically, it is desirable to acquire and store data at a rate of 200 MHz. Moreover, for greatest sensitivity, particularly where sample quantities are limited, it is desirable that data be continuously collected and recorded, with no pauses during operation. Ideally, every single ion reaching the ion detector is recorded in its proper time-resolved channel, and no data significance is lost.

With these time-resolved magnetic- or electric-sector instruments, the information contained in successive transient output pulse changes at rates up to 1000 times per second. Thus, assuming a pulse rate of 10 kHz, information could be lost if the information in more than ten pulses is averaged, although in many cases the data of fifty or more pulses might be averaged. Further, it will be appreciated that any pause in data collection (i.e. for readout following integration) can lead to a substantial loss of significant data.

SUMMARY OF THE INVENTION

It is an object of the invention to provide a high speed data acquisition and storage system for processing and recording data values from repetitive transient waveforms without loss of data significance.

It is another object of the invention to provide an integrating transient recorder capable of acquiring and integrating transient data at a rate in excess of 200 MHz.

It is another object of the invention to provide a data acquisition system capable of recording all the intensities of all transients and record all data without loss of data significance.

It is another object of the invention to provide an integrating transient recorder which effectively integrates sampled data as fast as it is acquired.

It is yet another object of the invention to provide an integrating transient recorder which continuously acquires and integrates data without interruption for data read out.

Briefly, in accordance with an overall concept of the invention, a high speed data acquisition and storage system for processing and storing input data values representative of the magnitude of a repetitive transient signal waveform sampled for each occurence at a plurality of sample points in time is provided. The system includes a data summation system for summing (digitally integrating) the data values in a predetermined number of individual time-resolved time bins over a predetermined number of repetitive transient signal waveforms with each time bin corresponding to a sample point, and for outputting the summed data in the time bins.

The system also includes a data reduction system for compacting the summed data from the time bins in real time, and a mass storage unit for receiving compacted data from the data reduction system, also in real time.

The data reduction system does various operations on the data, including limited calculations, before transferring the data to the mass storage unit. For example, a threshold is established, and all summed data values below this threshold are treated as zero. Any one of various data compaction techniques is employed. Mass spectrum peaks are identified through calculation and their position and magnitude recorded, without necessity for the raw data defining the peak to be recorded.

In a more particular aspect of the invention, there is provided a data summation system for receiving successive input data values representative of the magnitude of a repetitive transient signal waveform sampled for each occurence at a plurality of sample points in time, for summing the data values in a predetermined number of repetitive transient signal waveforms with each time bin corresponding to a sample point, and for enabling output of the summation results in each time bin to occur while continuing to receive and process incoming data. The data summation system includes at least one data summation subsystem, which in turn includes an input latch for temporarily storing each successive input data value, and a set of three summation subcircuits organized such that one is a common summation subcircuit capable of being paired with each of the others. Each summation subcircuit includes an adder with a pair of inputs, one adder input being connected to receive data from the input latch; an intermediate data latch connected for temporarily storing the output of the adder, and a memory having an individual memory location corresponding to each time bin, the memory being connected to the intermediate data latch for receiving data to be stored. The other adder input of each of the other summation subcircuits is connected to receive data from the memory of the common summation subcircuit.

The data summation subsystem also includes an input multiplexer and an output multiplexer arranged to interconnect the summation subcircuits for summation operation in pairs alternately selected from the common summation subcircuit and one of the other summation subcircuits, with the un-selected summation subcircuit enabled for read out of completed summation data. The input multiplexer connects the output of the memory of the selected one of the other summation subcircuits to the other adder input of the common summation subcircuit, and the output multiplexer connects the output of the memory of the un-selected one of the other summation subcircuits to an output of the data summation subsystem.

In operation, the data summation subsystem functions during the occurrence of each transient signal waveform for each successive input data value received to store the data value in the input latch, to read previously-stored cummulative sum data for the particular time bin corresponding to the input data value from the memory of one of the selected summation subcircuits, to add in the adder of the other of the selected summation subcircuits the previously stored cumulative sum data to the new data value stored in said input latch to provide a new cumulative sum for the particular time bin corresponding to the input data value, and to temporarily store the new cumulative sum in the intermediate latch of the other of the selected summation subcircuits. Memory read and write operations overlap, with new cumulative sum data for the particular time bin corresponding to the previous input data value stored in the intermediate latch of the other of the selected summation subcircuits being stored in the memory of the other of the selected summation subcircuits at the same time previously-stored cumulative new data is read from the memory of the one of the selected summation subcircuits. Following the occurrence of each complete transient signal waveform the roles of the two selected summation subcircuits are reversed. Following the predetermined number of repetitive transient signal waveforms, final cumulative sum data for each time bin is left in the memory of whichever of the selected summation subcircuits is not the common summation subcircuit.

Preferably, the data summation system includes a plurality of data summation subsystems, each including a subset of the individual time-bin, with input data being circulated to the individual data summation subsystems.

BRIEF DESCRIPTION OF THE DRAWINGS

While the novel features are set forth with particularity in the appended claims, the invention, both as to organization and content, will be better understood and appreciated from the following detailed description taken in conjunction with the drawings, in which:

DESCRIPTION OF THE PREFERRED EMBODIMENTS

Figure 1:
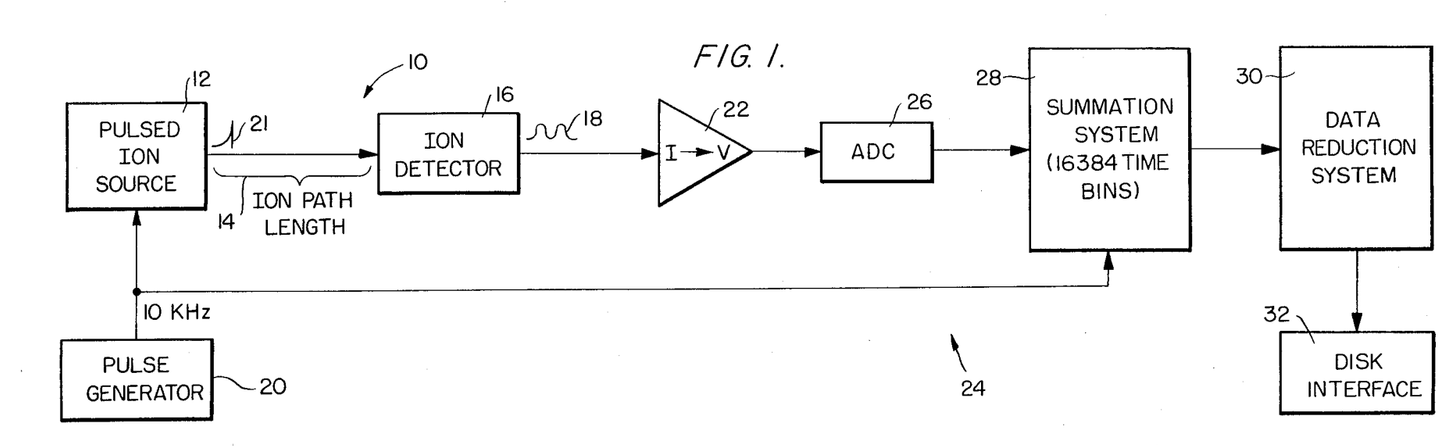
FIG. 1 is an overall block diagram of a time-of-flight mass spectrometer including an integrating transient recorder in accordance with the present invention.

Referring first to FIG. 1, a time-of-flight mass spectrometer, generally designated 10, comprises a pulsed ion source 12 for producing and accelerating ions to velocities inversely related to their mass, an ion path 14 for allowing separation or dispersion in time in accordance with ion velocity, and an ion detector 16 for detecting ion current and providing an output as a function of time as depicted by the transient analog waveform 18. The pulsed ion source 12 is controlled by a pulse generator 20.

In operation, the ion source 12 provides ions in discrete packets or bunches, such as represented at 21, and accelerates the ions to velocities as an inverse function of mass. Thus, heavier ions have lower velocities than lighter ions. An exemplary ion pulse width is 10 nanoseconds, with a repetition rate of 10 kHz being typical.

Along the ion path 14, the ions disperse as a function of their velocities, and therefore of their masses. The lighter, faster ions arrive first at the ion detector 16, followed by the heavier, slower ions. Thus, ion detector current as a function of time indicates ion mass, and the waveform 18 represents the mass spectrum of the ions comprising a single source pulse, e.g., for the source pulse (not shown) immediately preceeding the depicted pulse 21. The transient waveforms 18 then repeat at a 10 kHz rate.

The ion detector 16 is of any suitable type, for example an electron multiplier. The ion detector 16 has its output connected to an amplifier 22 suitably configured as a current-to-voltage converter.

An integrating transient recorder in accordance with the invention is generally designated 24, and represents the first of two levels of data reduction in the overall FIG. 1 system prior to mass storage.

More particularly, the integrating transient recorder 24 comprises a high-speed analog-to-digital converter 26 connected to a summation system 28 which samples the output of the ion detector 16 at a 200 MHz rate and digitally integrates, in individual time-resolved channels or "time bins", a plurality (e.g. any number from about 10 to 1000) of individual source pulses. In this example the individual ion pulses occur at a 10 kHz rate. By way of example, there are 16384 discrete time bins, each storing a representation of sampled ion current representative of a 5 nanosecond slice of time. The individual time bins collectively digitally represent the ion detector 16 output waveform integrated (digitally summed) over a plurality of individual source pulses. So long as the information contained in the individual transient pulses changes at a rate slower than the 10 kHz source pulse rate and is consistent with the number of pulses summed in individual time-resolved channels, no data significance is lost by this process.

To enable ion pulsing time to be correlated with arrival time of ions at the ion detector 16, the pulse generator 20 which controls the ion source 12 is also connected to the summation and store section 28. Although not specifically shown, it will be appreciated that a suitable delay element is preferably included so that, following each ion pulse from the source 20, data acquisition does not commence until the arrival time of the lightest (fastest) ions of each particular pulse. In the subject system, this time delay is included in the control and timing circuitry (not shown) for the integrating transient recorder 24.

Following the summation system 28 is a data reduction subsystem 30, described hereinafter with reference to FIG. 5. The output of the data reduction system is connected to a disk interface 32 which represents a mass storage unit. The data reduction system 30 thus represents the second of two levels of data reduction in the overall FIG. 1 system.

As is described hereinafter in detail with reference to FIGS. 3 and 4, the summation system 28 comprises an exemplary eight summation subsystems. Each summation subsystem includes three random-access memories (RAMs). For convenience of illustration only in FIG. 2, the three RAMs of each summation subsystem are represented as a single RAM bank. Thus there are eight representative RAM banks in total, designated RAM BANK 0 through RAM BANK 7.

Figure 2:
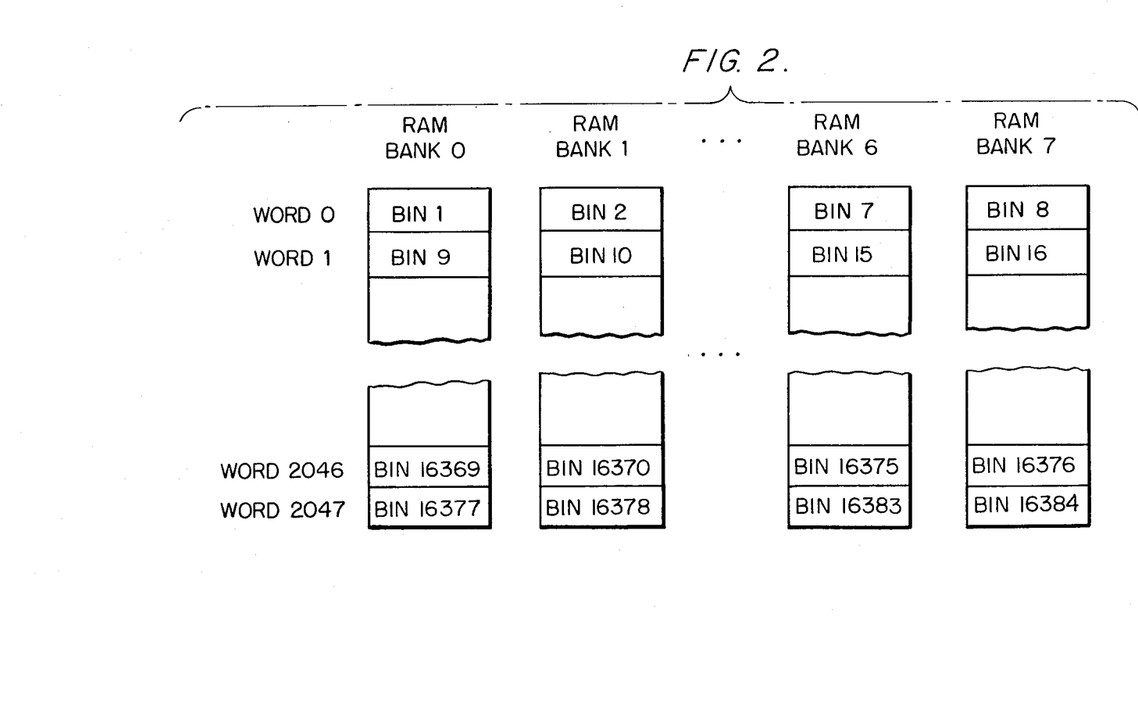
FIG. 2 is a memory map depicting the manner in which banks of random access memories are organized into "time bins" corresponding to individual time-resolved channels.

Each of the RAM's comprises an eighteen-bit x 2K emitter coupled logic (ECL) random access memory. As will be understood by those skilled in the art, a "2K" memory actually includes 2048 individually-addressed memory locations or words designated WORD 0 through WORD 2047. An 11-bit address is required for this memory size.

As depicted in FIG. 2, the first time bin, i.e., BIN 1, corresponds to WORD 0 of RAM BANK 0. Time BIN 2 corresponds to WORD 0 of RAM BANK 1. This sequence continues, as illustrated, with time BIN 16384 corresponding to WORD 2047 of RAM BANK 7. As will be apparent from the description hereinafter with reference to FIGS. 3 and 4, this arrangement allows data to be summed (digitally integrated) in real time at much faster rates than would apparently be permitted by the total cycle time required to perform a memory read operation, an addition, and a memory write operation, typically 40 nanoseconds.

Figure 3:
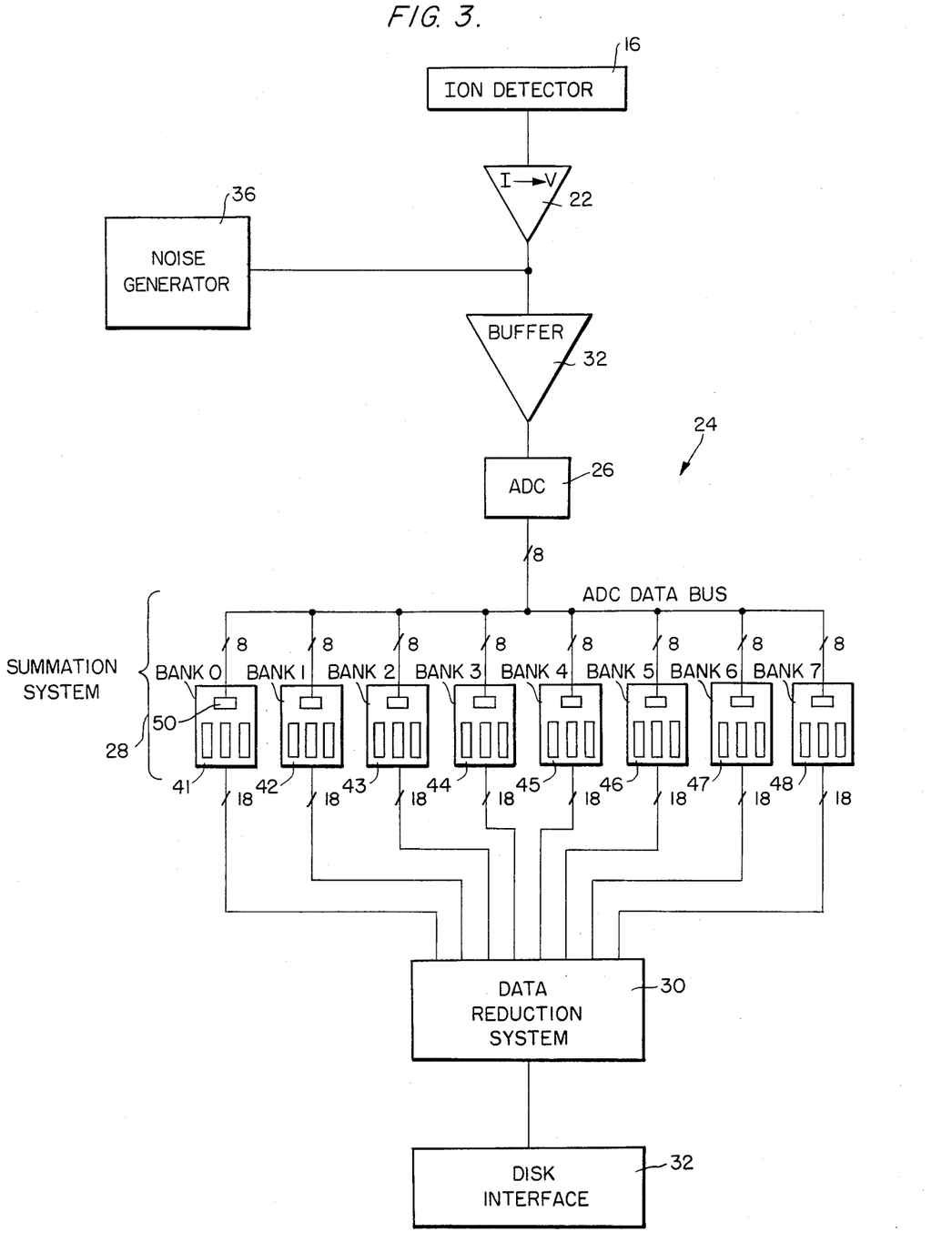
FIG. 3 is an overall block diagram of a data acquisition system in accordance with the invention.

With reference now to FIG. 3, the integrating transient recorder 24 of the invention is shown in greater detail.

As described above with reference to FIG. 1, the ion detector 16 has its output connected to the amplifier 22 configured as a current-to-voltage converter. The output of the current-to-voltage converter 22 is connected to a buffer amplifier 32, the output of which is connected to the input of the analog-to-digital converter 26.

A noise generator 36 is connected to the analog signal path between the current-to-voltage converter 22 and the buffer amplifier 32. The output level of the noise generator 36 is set to assure that the noise level is greater than the least significant bit of the subsequent eight-bit analog-to-digital converter 26 so that the summing (digital integration) increases the dynamic range.

The analog-to-digital converter 26 is an eight-bit flash converter having a $5 \times 10^{-9}$ second conversion time, and operates in the subject system at a data rate of $200 \times 10^6$ samples per second. A suitable device for the analog-to-digital converter 26 is a LeCroy Instrumentation Type No. TR8828.

Following the buffer amplifier 32 and the analog-to-digital converter 26 are three major subsystems, the summation system 28, the data reduction system 30, and the disk interface subsystem 32.

The output of the analog-to-digital converter 26 supplies an eight bit ADC DATA BUS, in turn connected to the inputs of eight individual summation subsystems 41 through 48, also designated BANK 0 through BANK 7.

Individual output busses of the summation subsystems are an exemplary 18 bits each. Since the output of the analog-to-digital converter 26 is only eight bits, this ensures that 1000 summations can be accomodated without danger of overflow, even if for a particular time bin corresponding to a particular sample point in time the analog-to-digital converter 26 is always outputting a maximum data value, i.e., $11111111_2$.

The data reduction subsystem 30, described below with reference to FIG. 5, performs further data processing, depending on the particular application. The disk interface subsystem 32 then provides high speed storage of the data on a disk, where it can be processed subsequently by a host computer (not shown) to determine and plot various spectra in accordance with the use to which the instrument is being put.

Figure 4:
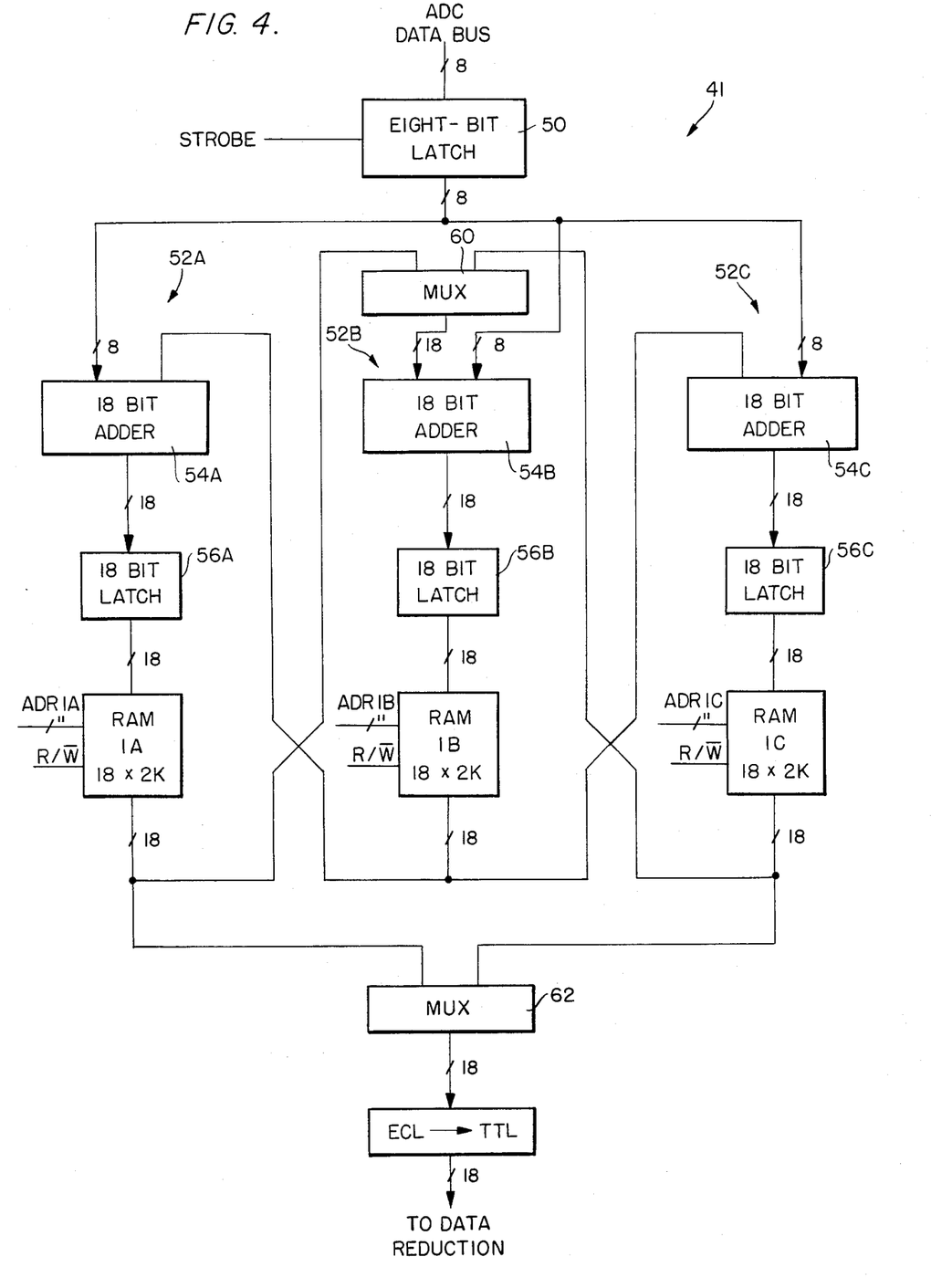
FIG. 4 is a block diagram depicting a representative one of eight summation systems in the FIG. 3 data acquisition system.

FIG. 4 depicts a representative one of the FIG. 3 summation subsystem 41 in greater detail. Except as noted, the various components in FIG. 4 are standard ECL digital logic circuits of the 100K ECL logic family manufactured by Fairchild Semiconductor.

In FIG. 4, an eight bit input latch 50 is connected to the eight-bit ADC DATA BUS, and latches in data upon receipt of a STROBE command from control logic circuitry (not shown). During operation of the overall FIG. 3 system, individual STROBE pulses are sequentially applied to the individual input latches in the summation subsystems in recirculating fashion such that data values from successive sample intervals are in turn latched into the eight-bit latches 50 in each of the summation subsystems, with the sequence then repeating.

Within the summation subsystem 41 are three summation subcircuits 52A, 52B and 52C organized such that one, specifically 52B, is a common summation subcircuit capable of being selectively paired with each of the other summation subcircuits 52A and 52C. Each of the summation subcircuits includes an adder 54A, 54B or 54C with a pair of inputs. One input of each of the adders 54A, 54B and 54C is connected to receive data from the input latch 50. Since the adders 54A, 54B and 54C are 18-Bit adders, the 8-bit output of the input latch 50 is connected to the least-significant data bit inputs, and the unused adder input bits are tied to logic "0".

Each of the summation subcircuits 52A, 52B and 52C also includes an intermediate data latch 56A, 56B or 56C connected for temporarily storing the output of the respective adder 54A, 54B or 54C.

Finally, each of the summation subcircuits 52A, 52B and 52C includes a respective random access memory RAM 1A, 1B and 1C. Each of the RAMs 1A, 1B and 1C is an 18-bit ×2K emitter coupled logic (ECL) device having a twenty nanosecond access time.

In operation, the summation subcircuits 52A, 52B and 52C are paired as either pair AB or pair BC and the summed data are stored alternately between the two RAMs of the selected pair until a complete integrated scan is obtained by repeated summing. More particularly, the sequence is to read out of one RAM, add, and then write into the other RAM of the selected pair for each input point of a particular transient waveform. At the conclusion of a complete integrating cycle, the aggregate sum point by point is stored in the outer RAM, e.g., RAM 1A or RAM 1C. Then the other pair is selected, and a new integrated scan is commenced. This allows the final sum which remains in the now-unselected outer RAM to be read out address by address and transferred to the data reduction subsystem 30 during the next subsequent integrated scan time. Further, this arrangement wherein data is read out of one RAM, added to incoming data, and stored in another RAM allows the operation to proceed at a faster rate because the READ/WRITE cyles of the two active RAMS occur at the same time.

To accomplish this operation, the other inputs of the adders 54A and 54C are connected to receive data from RAM 1B of the common summation subcircuit 52B. An input multiplexer 60 is arranged to correct the output of the memory RAM 1A or RAM 1C of the selected one of the subcircuits 52A or 52C to the other input of adder 54B. An output multiplexer 62 connects the output of the memory RAM 1A or 1C of the un-selected one of the data summation subsystems to the ECL to TTL converter.

Also, depicted in FIG. 4 are address inputs to the RAMs 1A, 1B and 1C, and READ/WRITE (R/W) control inputs. The RAM addresses and READ/-WRITE control signals are generated by the control logic (not shown).

The operation of the FIG. 4 summation subsystem 41 will now be described by way of a detailed example. In this example, it is assumed that subcircuits 52A and 52B are the selected active subcircuits, i.e., the input multiplexer 60 is selecting the output of the RAM 1A to apply to the input of the adder 54B. The other subcircuit 52C is enabled for data readout, the output multiplexer 62 selecting the RAM 1C for this purpose.

At the very beginning of a transient signal waveform, the first input data value intended for the summation subsystem 41, (for example, corresponding to time BIN 1) is latched into the input latch 50. Previously-stored cumulative sum data is read from WORD 0 of RAM 1A, corresponding to time BIN 1. However, for the first transient waveform in each integrated scan, the initial read for each time bin from RAM 1A is a dummy read because the beginning cumulative sum must, by definition, be zero. To accomplish this, advantageously a "master reset" command is applied to the input multiplexer 60 causing its output applied to the adder 54B to be zero, regardless of the input data.

The adder 54B then adds the data value from the multiplexer 60 output (zero for the first transient) to the data value stored in the input latch 50 to calculate a new cumulative sum for the particular time bin, and this new cumulative sum is temporarily stored in the intermediate latch 56B.

Upon receipt of the next input sample point intended for the summation subsystem 41B, this new point is latched into the input latch 50 as before. Again, the previously-stored cumulative sum is read from the RAM 1A and applied to the adder 54B through the multiplexer 60. Again, in the case of the first transient of a particular integration, the multiplexer 60 output is selected to be zero.

A significant feature of the FIG. 4 summation subsystem 41 is what happens to the cumulative sum data for the last previous time bin stored in the intermediate latch 56B. In particular, while previously-stored cumulative sum data is being read from RAM 1A for the current time bin, the new cumulative sum data for the preceding time bin is read from the intermediate latch 56B into the RAM 1B. Thus, the read and write memory cycles overlap, significantly speeding up the overall operation.

Operation for each input data point is divided into two phases with each phase being 20 nanoseconds. During the first phase, data is read from RAM 1A, while data stored in the latch 56B is simultaneously written into the RAM 1B. During the second phase, addition occurs in the adder 54B, and the results stored in the latch 56B.

Operation continues in this fashion until all 16384 time bins are filled. At this point, the roles of the subcircuits 52A and 52B reverse. In the reverse operation, as incoming data is latched into the input latch 50, previously-stored cumulative sum data for the current time bin is read from RAM 1B and summed in the adder 54A with the incoming data in the input latch 50, and the new cumulative sum is temporarily stored in the latch 56A. As in the case above, at the same time the RAM 1B is being read, the new cumulative sum corresponding to the previous time bin which was temporarily stored in the latch 56A is written into the RAM 1A.

This operation continues in alternating fashion until a predetermined number of transients have been integrated in individual time-resolved channels.

Significantly, this arrangement allows collection and integration of incoming data to proceed substantially continuously, with no time lost for data readout.

It will be appreciated the FIG. 4 summation subsystem 41 requires a control pulse generator to generate appropriately-timed control pulses, as well as to generate 11-bit memory addresses. This control circuitry (not shown) may be entirely conventional and implemented, for example, with continuously-running digital counters with suitably-decoded outputs.

Figure 5:
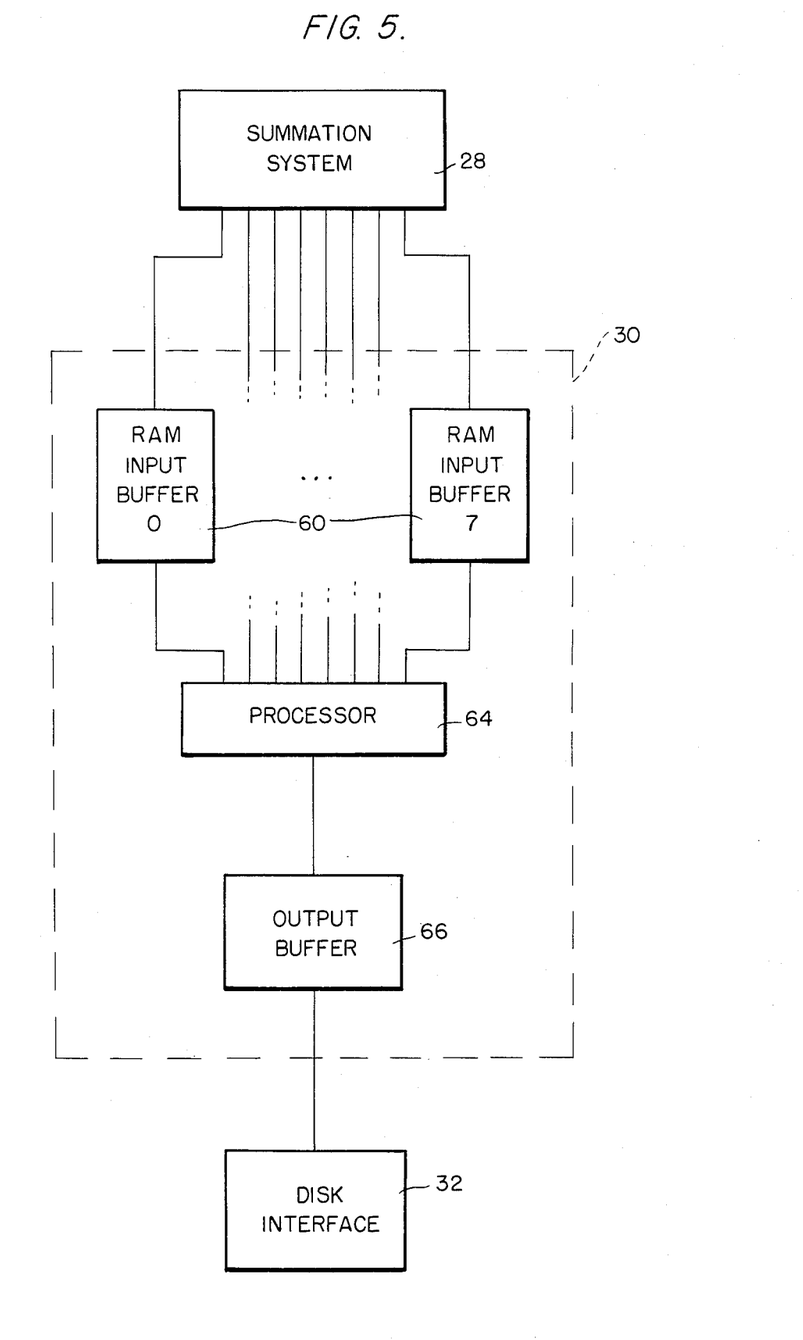
FIG. 5 is a block diagram of a data reduction subsystem.

FIG. 5 is a generalized block diagram of the data reduction system 30. The data reduction system 30 is a significant element in reducing the volume of data, without losing significance prior to storage on the mass storage disk via the disk interface 32. The data reduction system 30 includes a set 60 of input buffers, connected respectively to receive data from the individual summation subsystems as depicted in FIG. 3.

The data reduction system 30 includes a processor 64 which performs data compaction, as well as data analysis. The processor 64 is implemented employing bit-slice microprocessor elements executing appropriate algorithms. A relatively simple data reduction algorithm is to establish a threshold, and to treat all data values below this threshold as zero values. In accordance with any one of a variety of known data compaction techniques, the data are compressed with appropriate coding to indicate the position of the various zero and non-zero values.

Advantageously, the processor 64 performs a limited amount of data analysis, for example, determining the presence of mass peaks, and outputting summary data, i.e., the mass position and magnitude of a given peak. This, then, eliminates any need to store individual ion current data comprising the mass peak.

The final element in the data reduction system 30 is an output buffer 66, in turn connected to the disk interface 32.

The input buffers 60 and the output buffer 66 comprise standard digital logic memory.

Finally, the disk interface 32 is a modified standard disk controller connected to one port of a large, high-speed, dual port disk memory. The other port of the dual port disk memory is connected to the host computer (not shown). The disk interface 32 is arranged so that the summation system 28 and data reduction system 30 can take control of the high speed disk unit 32 and load data at high speed. After the data are written on a disk, control is transferred back to the host computer so that the data can be processed.

Figure 6:
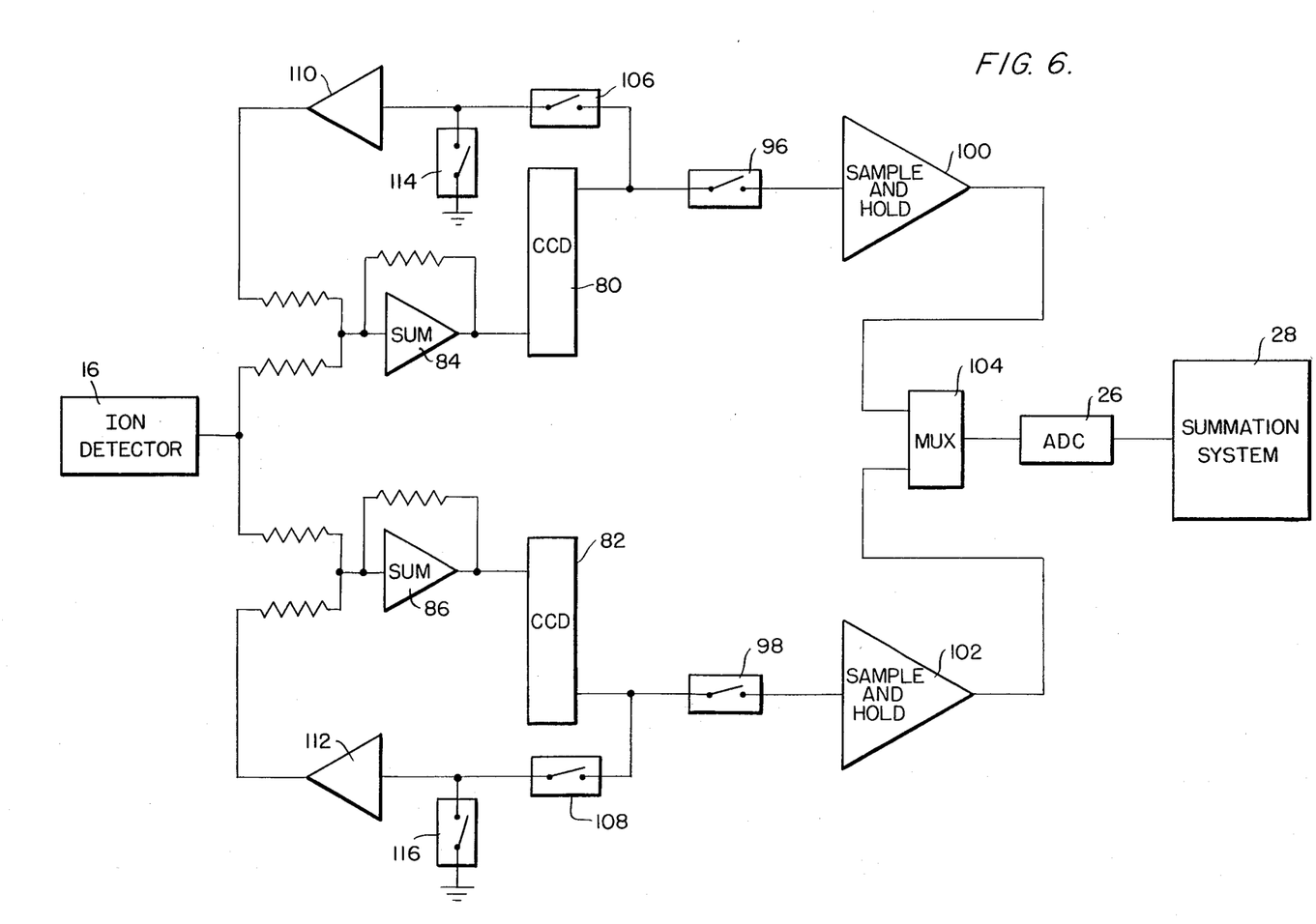
FIG. 6 is a block diagram of an embodiment employing charge-coupled devices as an analog summing and storage element.

Referring finally to FIG. 6, there is depicted in block diagram form an alternative arrangement of a high speed data acquisition and storage system. The FIG. 6 system employs charge coupled devices (CCD's) 80 and 82 as analog integration and storage devices to receive and initially integrate data from the ion detector 16. Charge-coupled devices are comparable to long shift registers, having a plurality of memory locations or cells. They have the capability of storing analog signals in the form of charge, and shifting the stored charge from one cell to the other in shift register fashion as the device is clocked. While charge-coupled devices are potentially capable of relatively high input data rates, and can thus lessen the speed requirements (and cost) of a subsequent digital summation system such as the summation system 28, presently-available charge-coupled devices are relatively limited in bandwidth and in the magnitude of the charge or signal which can be stored in each cell before saturation occurs. In particular, for the present application it is believed that an upper limit to integration in a charged coupled device would be in the order of 10 scans.

Referring to FIG. 6 in detail, the output of the ion detector 16 is connected through a pair of respective summing amplifiers 84 and 86 to serial inputs 88 and 90 of the CCD's 80 and 82. The summing amplifiers are part of a feedback path for each CCD to enable new incoming data to be summed with previously-stored cumulative sum data.

Respective serial outputs 92 and 94 of the CCD's 80 and 82 are connected through respective analog switches 96 and 98 for data readout to sample and hold circuits 100 and 102. The outputs of the sample and hold circuits 100 and 102 are illustratively alternatively selected by an analog multiplexer 104 connected to the input of the analog-to-digital converter 26. It will, however, be appreciated that other arrangements may be employed, such as arrangements which avoid the need for the output multiplexer 104 through suitable operation of the analog switches 96 and 98.

For feedback of previously-stored cumulative sum data, respective analog switches 106 and 108 and amplifiers 110 and 112 are connected from the CCD outputs 92 and 94 to the summing amplifiers 84 and 86. Finally, in order to provide a zero initial "previous" cumulative sum during the first transient of each plurality to be summed in time-resolved channels, analog switches 114 and 116 are provided to selectively ground the feedback paths.

In operation, assuming integration is to occur in CCD 80, for each incoming transient from the ion detector 16 the CCD 80 is clocked at high speed completely through as sampled data is serially applied to its input 88 via the summing amplifier 84. For the first transient, the switch 114 is closed, and so the incoming data is summed with zero. At the end of the first transient, the individual cells of the CCD 80 have stored in them the sampled values, with the first sample point of the transient being stored at the output 92 end of the CCD device 80, and the last sample point of the transient stored at the input end 88 of the CCD device 80. For the next nine input transients, as new sample points are received, the prior summed or integrated value for the particular time channel is read from the CCD 80 via output 92 and analog switch 106, summed with the incoming analog value in summing amplifier 84, and loaded back into the CCD 80 via input 88.

Following the time-resolved summation of an exemplary ten transients in CCD 80, the summation operation immediately switches to CCD 82 without pause and without loss of incoming data. Then while summation is occurring in CCD 82 in the same manner, CCD 80 is read out via analog switch 96. During readout, the clock rate applied to the CCD 80 is only one-tenth the high-speed rate for data acquisition.

In another embodiment (not shown), a single CCD series can be utilized. As the incoming signal is added to the prior sum for each cell and the resulting new sum is stored, a read out and clear process can be activated at a slower rate, reading and clearing, for example, every tenth cell. By this means, for every ten scans one summed scan can be converted and stored. The ratio of the input rate to the output rate determines the number of individual transients summed prior to digitization.

While specific embodiments of the invention have been illustrated and described herein, it is realized that numerous modifications and changes will occur to those skilled in the art. It is therefore, to be understood that the appended claims are intended to cover all such modifications and changes as fall within the true spirit and scope of the invention.

What is claimed is:

1. A high speed data acquisition system for processing input data values representative of the magnitude of sequential, substantially repetitive transient signal waveforms, sampled for each occurrence at a plurality of sample points in time, comprising a data summation system for summing the data values in a predetermined number of individual time-resolved time bins over a number of sequential transient signal waveforms, with each time bin corresponding to a sample point, including a plurality of data summation subsystems arranged in parallel channels to each other, means for directing input data values to one data summation subsystem at a time and sequentially to all of the data summation subsystems such that each parallel channel data summation subsystem receives and stores input data values in a repetitive sequence, each parallel data summation subsystem including at least first and second parallel data summation subcircuits, each having a memory bank therein, and input switching means for directing the input data values associated with sequential transient waveforms first to all of said first parallel data summation subcircuits for a given number of input transient signal waveforms such that a given number of transient waveforms are summed and stored in the first parallel data summation subcircuits in data summing operations, and said input switching means next directing the input data values associated with sequential transient waveforms to all of said second parallel data summation subcircuits for a given number of input transient signal waveforms such that a given number of transient waveforms are next summed and stored in the second parallel data summation subcircuits in data summing operations, whereby the first and second parallel data summation subcircuits alternately receive and sum input data values.

2. A high speed data acquisition system as claimed in claim 1, wherein said data summation system operates in real time on real time input data values of repetitive transient signal waveforms.

3. A high speed data acquisition system as claimed in claim 1, wherein said data summation system operates continuously on continuously supplied input data values of repetitive transient signal waveforms.

4. A high speed data acquisition system as claimed in claim 3, each parallel data summation subsystem including a third, common parallel data summation subcircuit having a memory bank therein, said third parallel data summation subcircuit being paired in sequence with each of the first and second data summation subcircuits while each of the first and second data summation subcircuits is being utilized in a data summing operation.

5. A high speed data acquisition system as claimed in claim 4, each data summation subsystem further including output switching means for outputting the summed data values from one of said first or second data summation subcircuits while the other of said first or second data summation subcircuits is receiving input data values from said input switching means in a data summing operation.

6. A high data speed acquisition system as claimed in claim 5, further including a data reduction system, coupled to all of said output switching means of all of said data summation subsystems, for compacting the summed data in real time, and a mass storage unit for receiving compacted data in real time.

7. A high speed data acquisition system as claimed in claim 6, each parallel data summation subsystem including:
 a. a strobed input latch for latching therein, upon receipt of a strobe signal, an input data value, and said means for directing input data values directs strobe signals sequentially to the input latches in all of the data summation subsystems to sequentially direct input data values to all of the data summation subsystems;
 b. each data summation subcircuit including;
  i. an adder with a pair of inputs, one adder input being connected to receive data from said input latch,
  ii. an intermediate data latch connected to the adder for temporarily storing the output of said adder, and
  iii. said memory bank having individual memory locations corresponding to individual time bins, said memory bank being connected to said intermediate data latch for receiving data to be stored;
 c. the other adder input of each of the first and second summation subcircuits being connected to receive data from the memory of the common third summation subcircuit; and
 d. said input switching means comprising an input multiplexer having its output coupled to the other adder input of said third common summation subcircuit, said input multiplexer being coupled to the memory outputs of said first and second summation subcircuits.

8. A high speed data acquisition system as claimed in claim 7, said output switching means in each data summation subsystem including an output multiplexer for reading out completed summation data from the memory of whichever one of the first and second summation subcircuits is not then coupled by said input multiplexer to the input of the adder of the third summation subcircuit subsystem.

9. A high speed data acquisition system as claimed in claim 8, including an input analog-to-digital converter for receiving analog input data values representative of the magnitude of each said sample data point in time and for converting the analog input data values to digital input data values which are coupled to said means for directing input data values.

10. A high speed data acquisition system as claimed in claim 1, each data summation subsystem further including output switching means for outputting the summed data values from one of said first or second data summation subcircuits while the other of said first or second data summation subcircuits is receiving input data values from said input switching means in a data summing operation.

11. A high speed acquisition system as claimed in claim 10, further including a data reduction system, coupled to all of said output switching means of all of said data summation subsystems, for compacting the summed data in real time, and a mass storage unit for receiving compacted data in real time.

12. A high speed data acquisition system as claimed in claim 10, each parallel data summation subsystem including:
 a. a strobed input latch for latching therein, upon receipt of a strobe signal, an input data value, and said means for directing input data values directs strobe signals sequentially to the input latches in all of the data summation subsystems to sequentially direct input data values to all of the data summation subsystems;
 b. a third, common summation subcircuit having a memory bank therein which is paired with each of the first and second summation subcircuits in data summing operations, each data summation subcircuit including;
  i. an adder with a pair of inputs, one adder input being connected to receive data from said input latch;

ii. an intermediate data latch connected to the adder for temporarily storing the output of said adder, and iii. said memory bank having individual memory locations corresponding to individual time bins, said memory bank being connected to said intermediate data latch for receiving data to be stored;

c. the other adder input of each of the first and second summation subcircuits being connected to receive data from the memory of the common third summation subcircuit; and d. said input switching means comprising an input multiplexer having its output coupled to the other adder input or said third common summation subcircuit, said input multiplexer being coupled to the memory outputs of said first and second common summation subcircuits.

13. A high speed data acquisition system as claimed in claim 12, said output switching means in each data summation subsystem including an output multiplexer for reading out of completed summation data from the memory of whichever one of the first and second summation subcircuits is not then coupled by said input multiplexer to the input of the adder of the third common summation subcircuit.

14. A high speed data acquisition system as claimed in claim 1, including an input analog-to-digital converter for receiving analog input data values representative of the magnitude of each said sample data point in time and for converting the analog input data values to digital input data values which are coupled to said means for directing input data values.

15. A high speed data acquisition system as claimed in claim 1, including at least one charge coupled device for receiving and integrating input data values, and coupled as an input to said data summation system.

16. A high speed data acquisition system as claimed in claim 1, including at least two charge coupled devices coupled in parallel for receiving and integrating input data values, and a multiplexer coupled to the outputs of said parallel charge coupled devices and coupled as an input to said data summation system.

* * * * *